United States Patent [19]
Poag et al.

[11] Patent Number: 5,958,517
[45] Date of Patent: Sep. 28, 1999

[54] SYSTEM AND METHOD FOR CLEANING NOZZLE DELIVERING SPIN-ON-GLASS TO SUBSTRATE

[75] Inventors: Frank D. Poag, Plano; Richard L. Guldi, Dallas; Douglas E. Paradis, Richardson; Paul C. Hashim, Plano, all of Tex.

[73] Assignee: Texas Instruments Incorporated, Dallas, Tex.

[21] Appl. No.: 08/994,910

[22] Filed: Dec. 19, 1997

Related U.S. Application Data

[60] Provisional application No. 60/033,863, Dec. 19, 1996.

[51] Int. Cl.$^6$ .................................. B05D 1/02; B05B 7/16
[52] U.S. Cl. ............................ 427/424; 118/302; 118/52; 118/320
[58] Field of Search ............................. 118/52, 302, 319, 118/320; 239/112–115, 106; 222/148; 427/240, 425; 134/10, 22.11, 22.12, 104.1, 104.2, 153, 157, 177, 198, 200, 902

[56] References Cited

U.S. PATENT DOCUMENTS

| | | | |
|---|---|---|---|
| 4,607,588 | 8/1986 | Stants et al. | 118/52 |
| 4,823,820 | 4/1989 | Larson et al. | 118/302 |
| 4,886,012 | 12/1989 | Ikeno et al. | 118/302 |
| 5,058,610 | 10/1991 | Kuriyama | 239/112 |
| 5,328,871 | 7/1994 | Tanigawa et al. | 437/231 |
| 5,360,995 | 11/1994 | Graas | 257/751 |
| 5,565,034 | 10/1996 | Nanbu et al. | 118/668 |
| 5,779,799 | 7/1998 | Davis | 118/52 |
| 5,849,084 | 12/1998 | Hayes et al. | 118/302 |

OTHER PUBLICATIONS

"Multilevel–Interconnect Technology for VLSI and ULSI" Chapter 4, pp. 176–236, *Silicon Processing for the VLSI Era*, vol. II, Process Integra © 1990, by Stanley Wolf, Ph.D.

*Primary Examiner*—David A. Simmons
*Assistant Examiner*—Calvin Padgett
*Attorney, Agent, or Firm*—Robert D. Marshall, Jr.; Gerald E. Laws; Richard L. Donaldson

[57] ABSTRACT

A system (12) for delivering spin-on-glass (SOG) to a substrate (14) has a spin chuck (16) for spinning a substrate (14), a delivery nozzle (18, 118, 218, 318, 418) having an interior conduit (419), a delivery nozzle-positioning subsystem (62) coupled to the delivery nozzle (18, 118, 218, 318, 418) for selectively positioning the delivery nozzle (18, 118, 218, 318, 418) over the spin chuck (16) for delivery of SOG, a SOG supply line (60, 160, 360) for supplying SOG, a cleaning fluid supply line (22, 122, 322) for supplying a cleaning fluid used to remove dried SOG, and a valve subsystem (20, 120, 320) fluidly coupled to the SOG supply line (60, 160, 360), cleaning-fluid supply line (22, 122, 322), and delivery nozzle (18, 118, 218, 318, 418) for selectively delivering SOG or a cleaning fluid through the interior conduit (419) of the delivery nozzle (18, 118, 218, 318, 418). A cleaning station 466 may be used to clean an exterior (421) of the nozzle (18, 118 218, 318, 418). A method for applying SOG to a substrate (14) through a delivery nozzle (18, 118,218,318,418) and for cleaning the delivery nozzle (18, 118, 218, 318, 418) includes the steps of delivering SOG to the substrate (14) and cleaning the nozzle (18, 118, 218, 318, 418) when cleaning is desirable by among other things delivering a cleaning fluid from a cleaning fluid supply line (22, 122, 322) through the valve subsystem (20, 120, 320) to the interior conduit (419) of the delivery nozzle (18, 118, 218, 318, 418) to remove any SOG from the interior conduit (419).

22 Claims, 6 Drawing Sheets

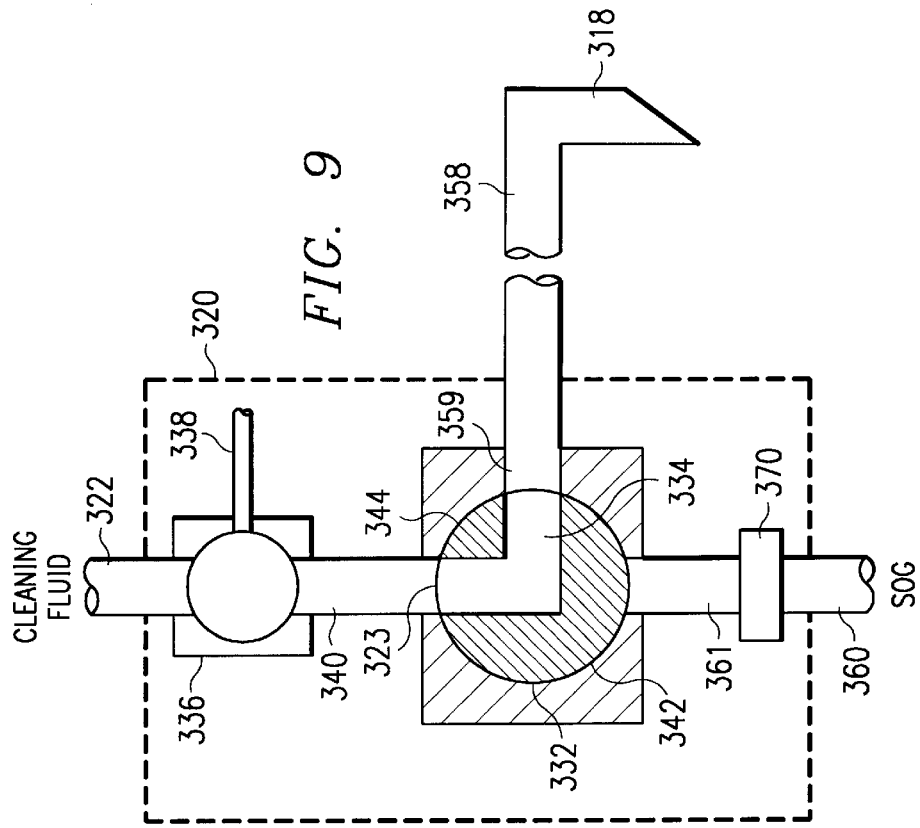
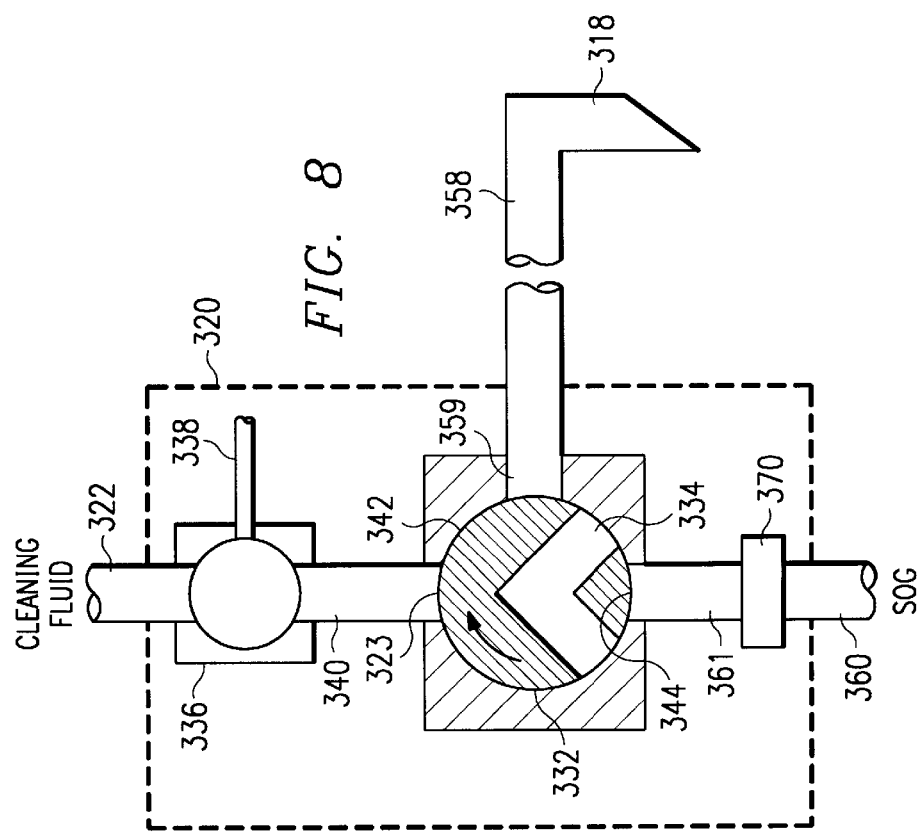

SYSTEM AND METHOD FOR CLEANING NOZZLE DELIVERING SPIN-ON-GLASS TO SUBSTRATE

This application claims priority under 35 USX 119 (e) (1) of provisional application Ser. No. 60/033,863, filed Dec. 19, 1996.

TECHMCAL FIELD OF THE INVENTION

This invention relates generally to the field of integrated circuits and their manufacture, and more particularly to a system and method for delivering spin-on-glass to a substrate.

BACKGROUND OF THE INVENTION

In order to build an integrated circuit, it is necessary to fabricate many active devices on a single substrate. Initially, each of the devices must be electrically isolated from others, but later in the fabricating sequence, specific devices must be electrically interconnected so as to implement the desired circuit function. Since both MOS and bipolar VLSI and ULSI devices typically require more than one level of interconnect, multilevel-interconnect structures are used. Multilevel-interconnect structures pose a number of challenges such as planarization of the intermetal dielectric layers and filling of high-aspect-ratio contact holes and vias. See generally, Stanley Wolf, *Silicon Processing For The VLSI Era,* Vol. 2, Chp. 4 (1990).

Spin-on glass (SOG) may be used in the fabrication of integrated circuits for, among other things, planarization. See, e.g., U.S. Pat. No. 5,360,995, entitled "Buffered Capped Interconnect For A Semiconductor Device," which is incorporated herein by reference for all purposes. SOG is another interlevel-dielectric material that is supplied in liquid form and, therefore, exhibits planarization capabilities similar to those of polyimide films. SOG films typically provide somewhat lower degrees of planarization than do photoresists. SOG and polyimide films can both typically fill narrower spaces without causing voids in contrast to the formats of CVD intermetal dielectric films. Crevices such as those caused by closely spaced metal-1 and polysilicon edges can be planarized by SOG to a degree that allows for adequate metal step coverage.

SOG materials are typically siloxanes or silicates mixed in alcohol-based solvents. The primary difference between them being that small percentage of Si—C bonds remain in the siloxane-based SOGs following the final cure cycle. Upon baking, the solvents are driven off and the remaining solid film exhibits properties similar to those of silicon dioxide ($SiO_2$) as opposed to the organic film in the case of polyimides. Silicate SOGs can also be doped with such compounds as $P_2O_5$ to improve the dielectric film properties.

With respect to the formation of a SOG layer, after being spun on the substrate, the SOG may be baked first at low temperature (e.g., 150–250° C. for 1–15 minutes in air), and then at a higher temperature (e.g., 400–425° C. for 30–60 minutes in air). The solvent is first driven off, and water is evolved from the film due to polymerization of the silanol (SiOH) groups. The loss of considerable mass together with material shrinkage may create a tensile stress in the film.

If any particulates are dispensed by a SOG delivery nozzle onto the substrate, the results can be catastrophic with respect to integrated circuits formed on the substrate. This can be particularly a problem with SOG because SOG may dry on the nozzle or in the SOG supply pipes and become a particulate with the potential to cause failure of the integrated circuits. Because the solvents evaporate from the SOG fairly quickly after being exposed to air so as to form particulates, the dispense nozzle must be cleaned with some frequency. Without adequate cleaning, dried-SOG particulates on the nozzle can dislodge and come into contact with the substrate causing possible failure of integrated circuits formed on the substrate.

SUMMARY OF THE INVENTION

In accordance with the present invention, a system and method for delivering spin-on-glass to a substrate is provided that substantially eliminates or reduces disadvantages and problems associated with previously developed spin-on-glass application systems. According to an aspect of the present invention, a system for delivering spin-on-glass (SOG) to a substrate may include a spin chuck for spinning a substrate, a delivery nozzle having an interior conduit, a delivery nozzle-positioning subsystem coupled to the delivery nozzle for selectively positioning the delivery nozzle over the spin chuck for delivery of SOG to a substrate, a SOG supply line for supplying SOG, a cleaning fluid supply line for supplying a cleaning fluid for removal of dried SOG, and a valve subsystem fluidly coupled to the SOG supply line, cleaning-fluid supply line, and the delivery nozzle for selectively delivering SOG or a cleaning fluid through the interior conduit of the delivery nozzle.

According to another aspect of the present invention a system for delivering SOG to a substrate includes a nozzle-cleaning station having a nozzle-receiving-cavity housing forming a cavity for receiving the nozzle during cleaning and having a plurality of angled surfaces coupled to the nozzle-receiving-cavity housing for reflecting a cleaning fluid delivered through the interior conduit of the delivery nozzle onto an exterior surface of the delivery nozzle.

According to another aspect of the present invention, a method for applying SOG to a substrate through a delivery nozzle and for cleaning the delivery nozzle with a cleaning fluid includes the steps of placing a delivery nozzle over a substrate spinning on a spin chuck; delivering SOG from a SOG supply line through a valve subsystem to an interior conduit of the delivery nozzle; and cleaning the nozzle when cleaning is desirable by positioning the nozzle over a cleaning station, delivering the cleaning fluid from a cleaning fluid supply line through the valve subsystem to the interior conduit of the delivery nozzle to remove any SOG from the interior conduit of the delivery nozzle.

A technical advantage of the invention is that the interior conduit of a main delivery nozzle is cleaned and not just an exterior portion of the delivery nozzle. Another technical advantage of the present invention is that the exterior of the delivery nozzle may be cleaned by the same cleaning solution that cleans the interior conduit of the delivery nozzle. Another technical advantage of the present invention is that the cleaning solution for cleaning the delivery nozzle may be filtered and recirculated thereby reducing replenishment and disposal costs.

BRIEF DESCRIPTION OF THE DRAWINGS

For a more complete understanding of the present invention, the objects and advantages thereof, reference is now made to the following descriptions taken in connection with the accompanying drawings in which:

FIG. 8 is a schematic of the valve subsystem of FIG. 7 at a second time;

FIG. 9 is a schematic of the valve subsystem of FIGS. 7 and 8 at a third time.

DETAILED DESCRIPTION OF THE INVENTION

The preferred embodiment of the present invention and its advantages are best understood by referring to FIGS. 1 through 10 of the drawings, like numerals being used for like and corresponding parts of the various drawings.

Figure 1:
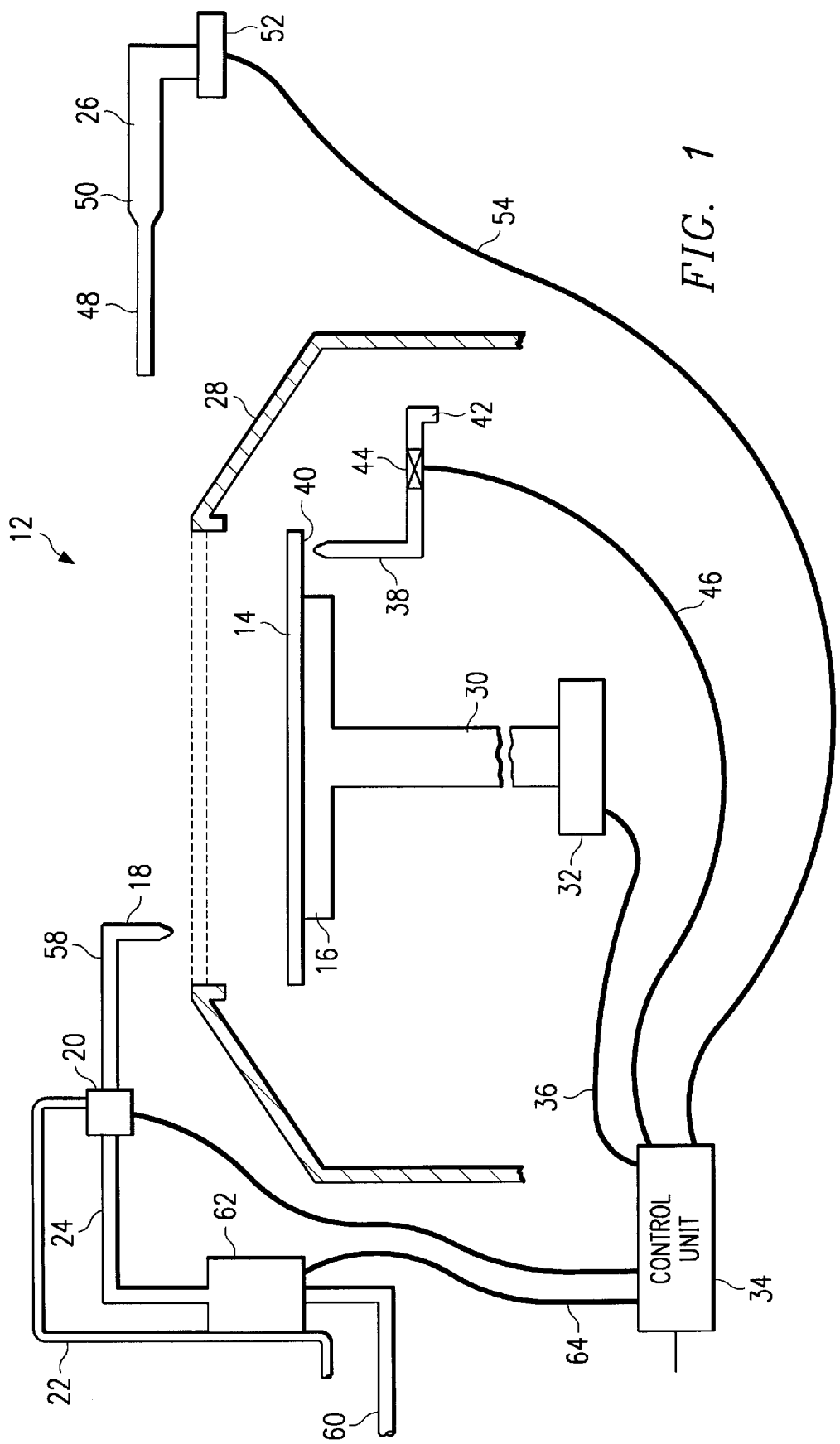
FIG. 1 is a schematic diagram of a system for delivering SOG to a substrate according to an aspect of the present invention.

Referring to FIG. 1, a system 12 for delivering spin-on-glass (SOG) to a substrate or wafer 14 is shown. System 12 may include a spin chuck 16, a main delivery nozzle 18, a delivery nozzle valve subsystem 20, a cleaning fluid supply line 22, a first SOG supply line 24, and a control unit 34. System 12 may also include a wafer transfer mechanism 26 and processing cup or exhaust bowl 28.

During the application of SOG to substrate 14, spin chuck 16 retains substrate 14. Spin chuck 16 is rotated by a rotating shaft 30. Shaft 30 is coupled to spin chuck 16 and to a motor 32. Motor 32 may be coupled to the control unit 34, which contains a microprocessor and sufficient memory for controlling control system 12. Motor 32 may be coupled to control unit 34 by a connection cable 36 or other medium.

A nozzle 38 for cleaning a lower side 40 of substrate 14 may be provided. Nozzle 38 may be coupled to a cleaning fluid supply line 42, which is connected to a cleaning fluid reservoir or supply. A control valve 44 may be placed between nozzle 38 and a portion of supply line 42 to control the fluid flow therein. Valve 44 may be electrically or pneumatically coupled to control unit 34 by a connection cable 46 or other medium for selective operation and control by control unit 34.

Substrate 14 may be placed and removed from spin chuck 16 by wafer transfer mechanism 26. Wafer transfer mechanism 26 may be any of numerous types of devices or systems, but is shown including a wafer holding device 48 and an extension arm 50. Wafer transfer mechanism 26 may include one or more precision motors 52 for placing wafer holding device 48 in various positions to allow substrate 14 to be placed on spin chuck 16 and removed to other locations such as other processing equipment. Wafer transfer mechanism 26 may be electrically coupled by connection cable 54 to control unit 34 to coordinate placement and removal of substrate 14.

Main delivery nozzle 18 has an interior conduit (shown as 419 in FIG. 10) for SOG delivery and also at other times may have a cleaning fluid flow through it for removing SOG therefrom. Delivery nozzle 18 is coupled to valve subsystem 20. As used herein with reference to flow devices, "coupled" includes the concept of fluidly coupling devices so that at least at selected times fluid may flow between the devices. A number of intermediate fittings and devices may be placed in the flow path of two coupled devices. For example, delivery nozzle 18 is coupled to valve subsystem 20 with a first nozzle supply line 58 between them.

Figure 2:
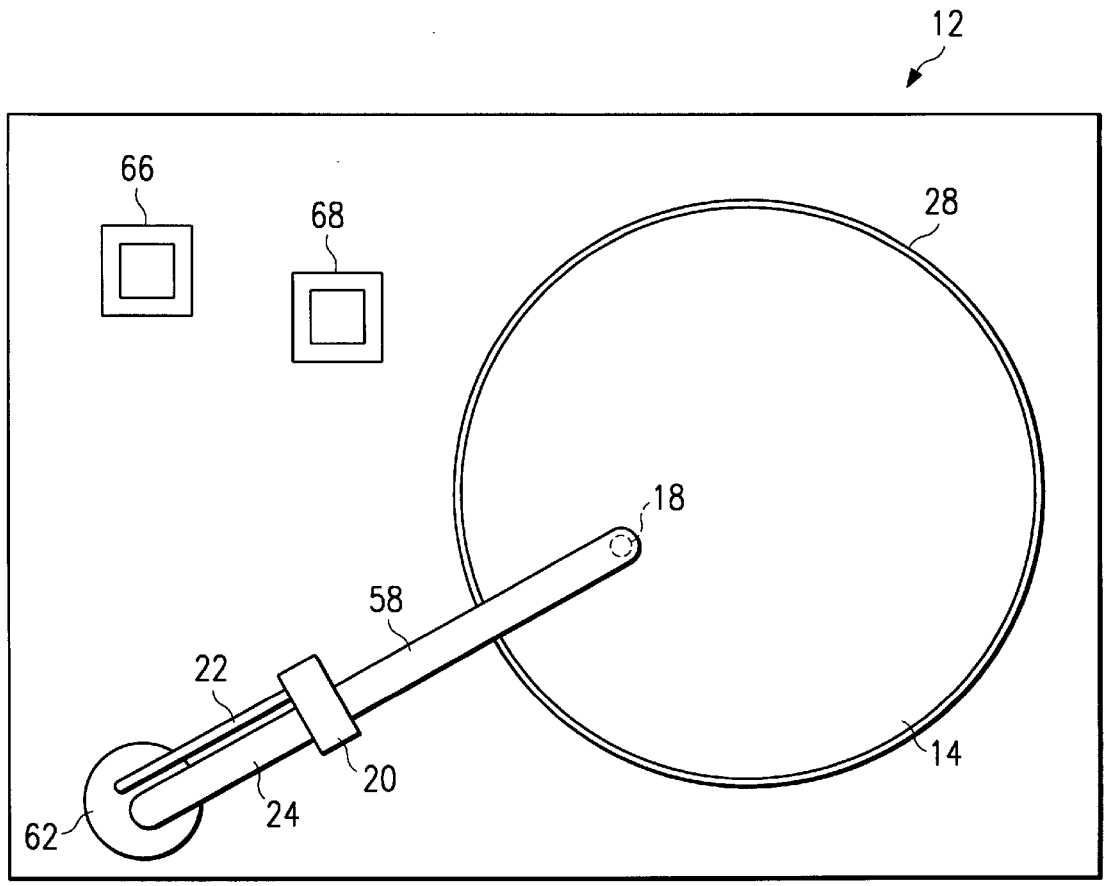
FIG. 2 is a plan view schematic of a system for delivering SOG to a substrate.

First nozzle supply line 58 fluidly connects delivery nozzle valve subsystem 20 with main delivery nozzle 18. Delivery nozzle valve subsystem 20 is also fluidly coupled to a first SOG supply line 24 and a cleaning fluid supply line 22 (which is coupled to a cleaning fluid reservoir or supply). First SOG supply line 24 may be coupled to a second SOG supply line 60 (which is coupled to a SOG reservoir or supply) and a main-delivery nozzle positioning subsystem 62 may be provided between second SOG supply line 60 and first SOG supply line 24. The cleaning fluid supply line 22 may also be attached to main-delivery nozzle-positioning subsystem 62. Main delivery nozzle positioning subsystem 62 may be electrically or pneumatically coupled by connection cable or medium 64 to control unit 34. Positioning subsystem 62 allows for the positioning of main delivery nozzle 18 in various locations over substrate 14 as well as moving nozzle 18 to other locations such as a nozzle waiting and cleaning station 66 (FIG. 2) or a waiting and purging station 68 (FIG. 2). Positioning system 62 may include a linear portion, e.g., supply line 24 and supply line 58, that is rotated to various locations over substrate 14 and to stations located within a given radius such as stations 66 and 68 (FIG. 2). Alternatively, system 62 could also include extendable arms that allow for positioning of nozzle 18 or other devices.

In operation, under the control and coordination of control unit 34, wafer transfer mechanism 26 delivers a substrate 14 to spin chuck 16 whereupon main-delivery nozzle positioning subsystem 62 may position main delivery nozzle 18 over selected locations of substrate 14 for delivery of SOG thereto. After delivery of SOG, positioning system 62 may retract nozzle 18 to allow transfer mechanism 26 to remove substrate 14 from spin chuck 16.

During periods of extended dormancy, there may be a tendency for SOG to dry on nozzle 18 and within portions of the interior conduit of nozzle 18 or first supply line 58. Therefore, either periodically or after a certain number of cycles or upon a certain amount of time of dormancy, the delivery nozzle valve subsystem 20 may close off SOG delivered by first supply line 24 and allow a SOG cleaning fluid to be supplied from cleaning fluid supply line 22 into the valve subsystem 20 through first nozzle supply line 58 and through nozzle 18 to clean nozzle 18. A number of liquids may be used for the cleaning fluid; examples of liquids for the SOG cleaning fluid are organic solvents such as ethanol, isopropyl alcohol, butyl cellosolve acetate, propylene glycol monopropyl ether, acetone, ethyl cellosolve acetate, ethyl ethoxypropionate, cyclohexanone or the like, or an aqueous solution containing hydrofluoric acid or ammonium fluoride. The aqueous solution may be a buffered solution of hydrofluoric acid or ammonium fluoride and acetic acid mixture.

A waiting and cleaning station 66 (FIG. 2) may be used with nozzle 18 to clean an exterior portion of the nozzle as well as providing a location for the cleaning fluid to be collected. A station suitable for use is described in connection with FIG. 10.

Referring now to FIG. 2, a schematic plan view of system 12 of FIG. 1 is shown. Main-delivery-supply-positioning subsystem 62 may position delivery nozzle 18 over various portions of substrate 14, but also to one or more waiting stations such as nozzle and cleaning station 66 or waiting and purging station 68. Waiting and cleaning station 66 may provide a place for cleaning fluid to be collected and recirculated as well as for cleaning fluid to be strategically reflected onto nozzle 18 to provide cleaning of the exterior of the nozzle as described in connection with FIG. 10.

Numerous types of three-way valves may be used with delivery nozzle valve subsystem 20. Delivery nozzle valve subsystem 20 selectively delivers SOG from supply line 24 or cleaning fluid from supply line 22 and in some instances a neutral gas into first nozzle supply line 58. In one form it may involve a three-way valve with lines 22, 24 and 58 attached thereto. Preferably, valve subsystem 20 will provide for continued cleaning of the associated valve seats and surfaces. Two examples of suitable valve systems are presented below. The first is presented in connection with FIGS. 3 through 6 and the second in connection with FIGS. 7 through 9.

Referring to FIGS. 3 through 6, a valve subsystem 120 that is suitable for use as delivery nozzle-valve subsystem 20 of FIGS. 1 and 2 is shown. Valve subsystem 120 selectively provides a SOG cleaning solution to nozzle 118 or SOG to nozzle 118.

A first nozzle supply line 158 fluidly couples nozzle 118 with valve subsystem 120. A cleaning fluid supply line 122 provides SOG cleaning fluid to system 120, and SOG supply line 160 supplies SOG to system 120. A pull back valve 170 may be provided on a portion of SOG supply line 160 or line 158 to provide a slight negative pressure to pull SOG away from portions of nozzle 118 when the delivery of SOG to nozzle 118 is terminated. Pull back valve 170 may be located at other locations as well; for example, pull back valve 170 may be coupled to a portion of line 158 or coupled to control valve 174 to provide a slight negative pressure to pull SOG away from portions of nozzle 118 when the delivery of SOG to nozzle 118 is terminated. Pull back valve 170 may be electrically or pneumatically coupled to a control unit, such as control unit 34 of FIG. 1, by a connection cable or medium 172. SOG supply line 160 may then deliver SOG to a first valve 174.

First intermediate conduit or line 176 fluidly couples first valve 174 to a second valve 178. Valves 174 and 178 may be electrically or pneumatically coupled to a control unit, such as control unit 34 (FIG. 1), by connection cables or medium 180 and 182, respectively. A pressure transducer 190 may be provided on intermediate conduit 176. Pressure transducer 190 may be coupled by connection cable 192 to a control unit, such as control unit 34 of FIG. 1.

Cleaning fluid supply line 122 may be fluidly coupled to a third valve 184, which also may be electrically or pneumatically coupled to a control unit, such as control unit 34 of FIG. 1, by connection cable or medium 186. A second intermediate line or conduit 188 may fluidly coupled to valve 184 and first intermediate line 176. As will be described later, in some instances it may be desirable to provide a T-fitting on line 188 to allow for a neutral gas or other type of gas to be delivered in line 188 to dry or purge interior surfaces of portions of subsystem 120 and nozzle 118.

Figure 3:
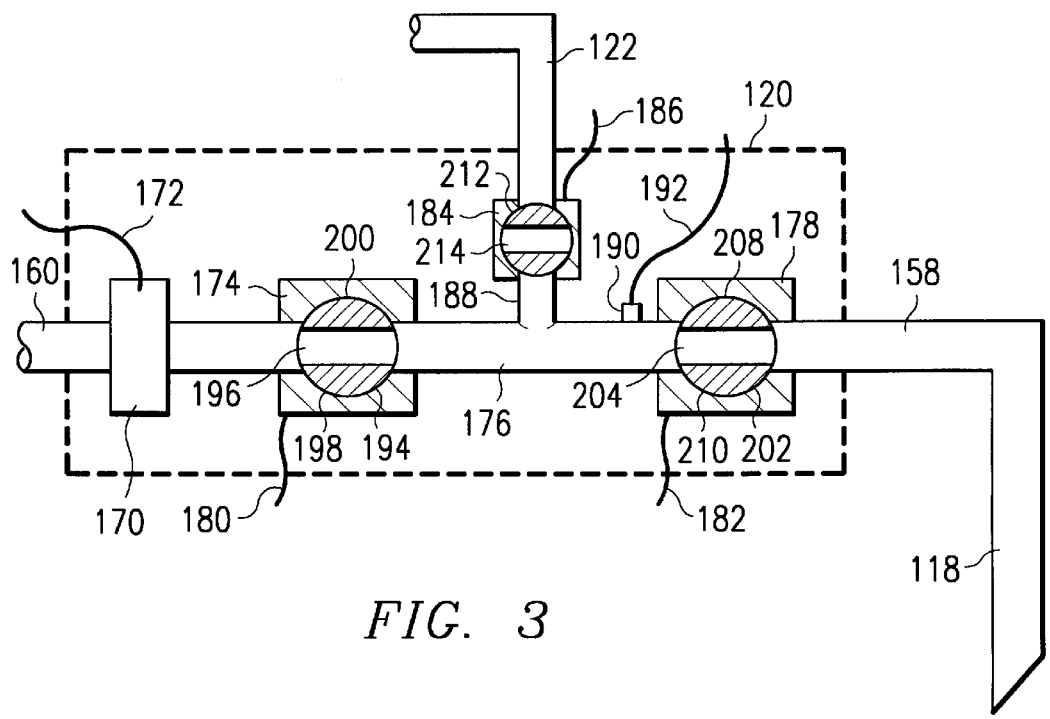
FIG. 3 is a schematic of a delivery nozzle valve subsystem at a first time.

In FIG. 3, valves 174 and 178 are shown in the open position allowing SOG to flow from line 160 into first intermediate line 176 then and through open valve 178 into first nozzle supply line 158 and onto nozzle 118. Valve 184 is in the closed position preventing cleaning fluid in line 122 from entering intermediate line 176 and preventing fluid in intermediate line 176 from flowing into line 122. When SOG is not desired for delivery to nozzle 118, either valve 174 or 178 may be closed.

Figure 4:
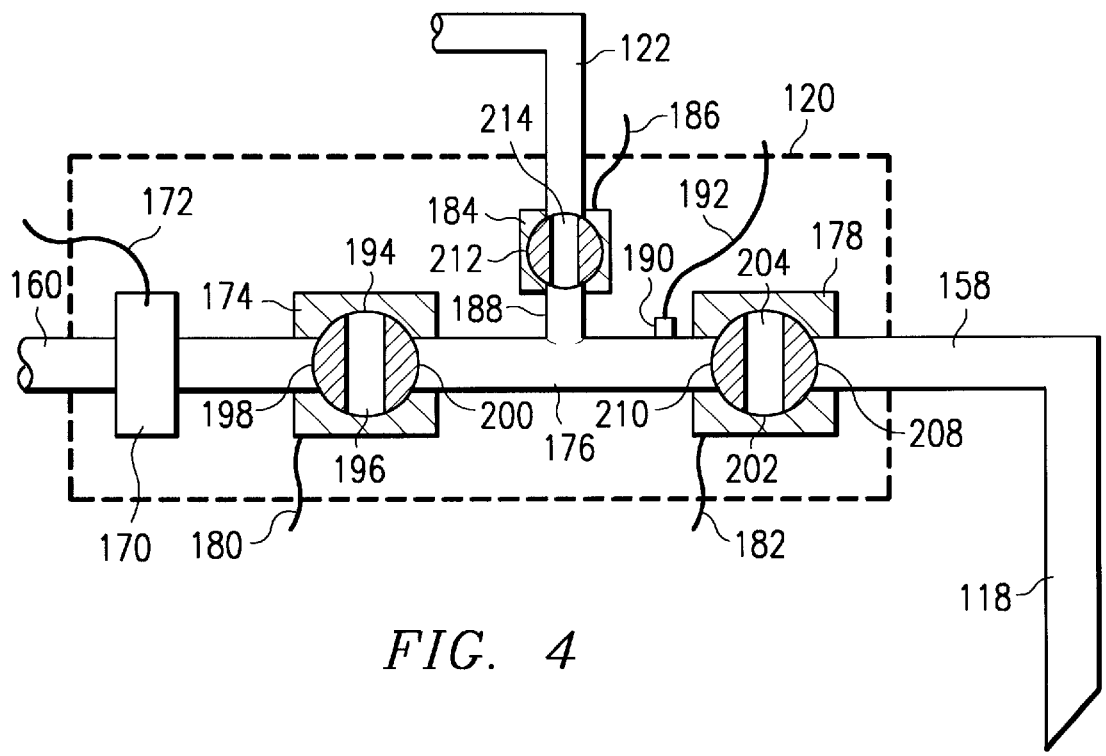
FIG. 4 is a schematic of the valve subsystem of FIG. 3 at a second time.

Referring now to FIG. 4, if cleaning of nozzle 118 is desirable, e.g., a sufficient time (dormant time) has passed so that dried SOG may appear on nozzle 118 or after a given number of cycles or after a contaminate has been detected in the SOG, nozzle 118 and portions of the lines supplying nozzle 118 may need cleaning with a cleaning fluid. It will then be desirable to position nozzle 118 over station 66 or 68 (FIG. 2) and to cause the valve subsystem 120 to deliver a cleaning fluid to nozzle 118 to remove SOG therefrom. In many occasions, it desirable to provide a cleaning fluid to an exterior of nozzle 118 as well (see FIG. 10). To deliver cleaning fluid to nozzle 118, valve 174 will be closed and valve 184 opened with valve 178 open. To clean the valve seats or exposed surfaces of valves 174 and 178, it may be desirable to first empty line 176 of SOG and fill it with cleaning fluid as will be described further below. FIG. 4 shows system 120 at a time after valve 174 has been closed, valve 184 opened to allow most of the SOG in line 176 to exit through valve 178, and then after valve 178 has been closed.

A number of different valve types may be used with system 120. Valve 174 may have a disk or flow directing device 194 that may be positioned such that a passageway 196 is no longer available to SOG supply line 160. As shown, a first surface of the disk 198 is placed against the SOG to close off line 160, and a second surface 200 is exposed to intermediate line 176. Similarly, valve 178 has a disk 202 having a passageway 204, which has been positioned such the passageway 204 is not available to nozzle supply line 158. A first surface 208 of disk 202 is exposed to a portion of line 158 and a second surface 210 is exposed to intermediate line 176.

Figure 5:
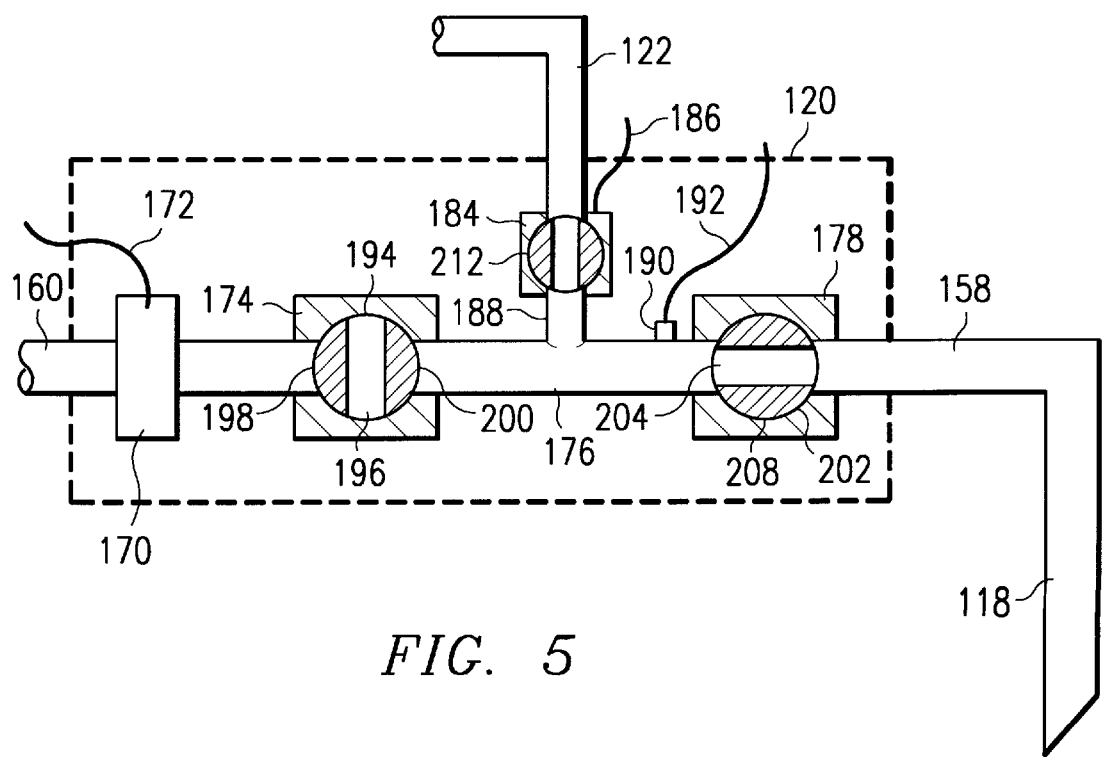
FIG. 5 is a schematic of the valve subsystem of FIGS. 3 and 4 at a third time.

Similar to valves 174 and 178, valve 184 has a disk 212 which may be positioned to allow passage 214 to allow cleaning fluid in cleaning fluid supply line 122 to enter intermediate line 176. Note that in the current conditions of valves 174, 178 and 184, the cleaning fluid is forced against surface 200 of disk 194 and surface 210 of disk 202, thereby cleaning any SOG off any portion of the respective valves 174 and 178 exposed. As noted above, prior to closing valve 178, it may be left open for a period of time such that cleaning fluid is delivered through valve 178 through nozzle 118 to remove SOG. Valve 178 may then be closed allowing surfaces 200 and 210 to be cleaned by the cleaning fluid for a set period of time or until pressure transducer 190 reflects predetermined pressure. At that point, valve 178 may be opened to allow additional cleaning fluid from line 122 to flow through intermediate line 176 and into nozzle 118. This latter condition is shown in FIG. 5. Cleaning fluid from cleaning fluid supply line 122 may be pulsed, (e.g., pulsed opening and closing of valve 184) to provide cleaning agitation and facilitate cleaning of surfaces.

Figure 6:
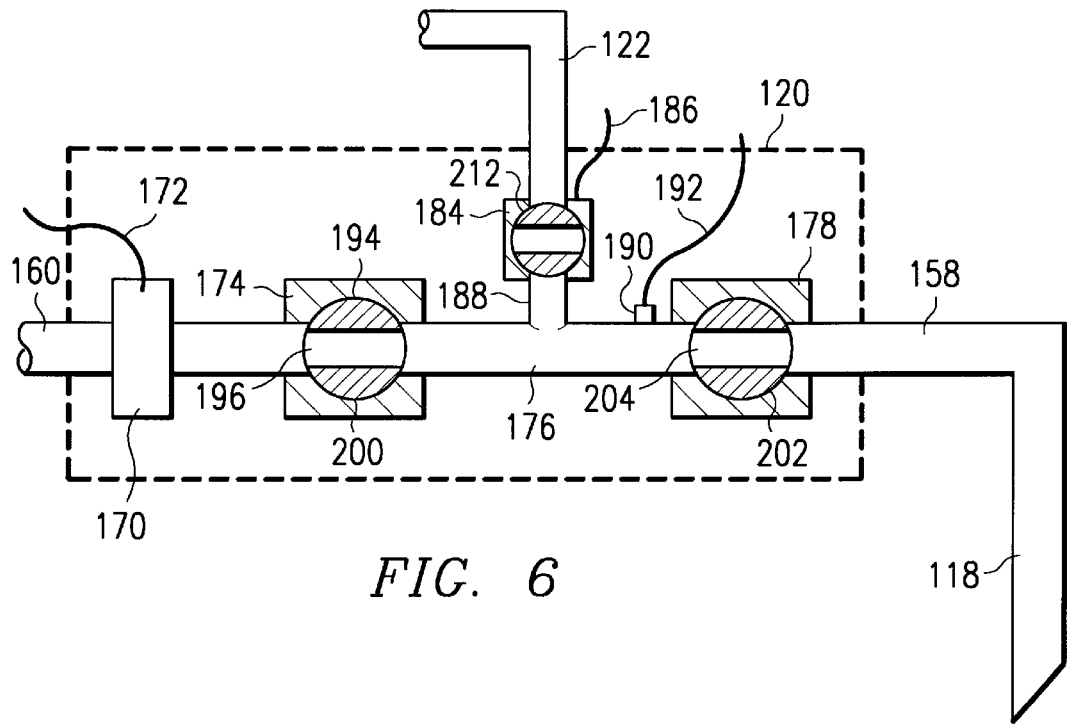
FIG. 6 is a schematic of the valve subsystem of FIGS. 3–5 at a fourth time.

After a sufficient amount of cleaning has been conducted on nozzle 118, valve 184 may be closed while valve 178 remains open. In some instances, a gas supply may be provided to intermediate line 176 to dry or purge any cleaning solution from lines 176 and 158 and nozzle 118, after which valve 200 may be opened as shown in FIG. 6. Note that the disk 194 may be positioned each time such that during different cleaning cycles, different portions or the disk will come into contact with the cleaning fluid in intermediate line 176. This is also true for valve 178 such as they are continuously cleaned.

Figure 7:
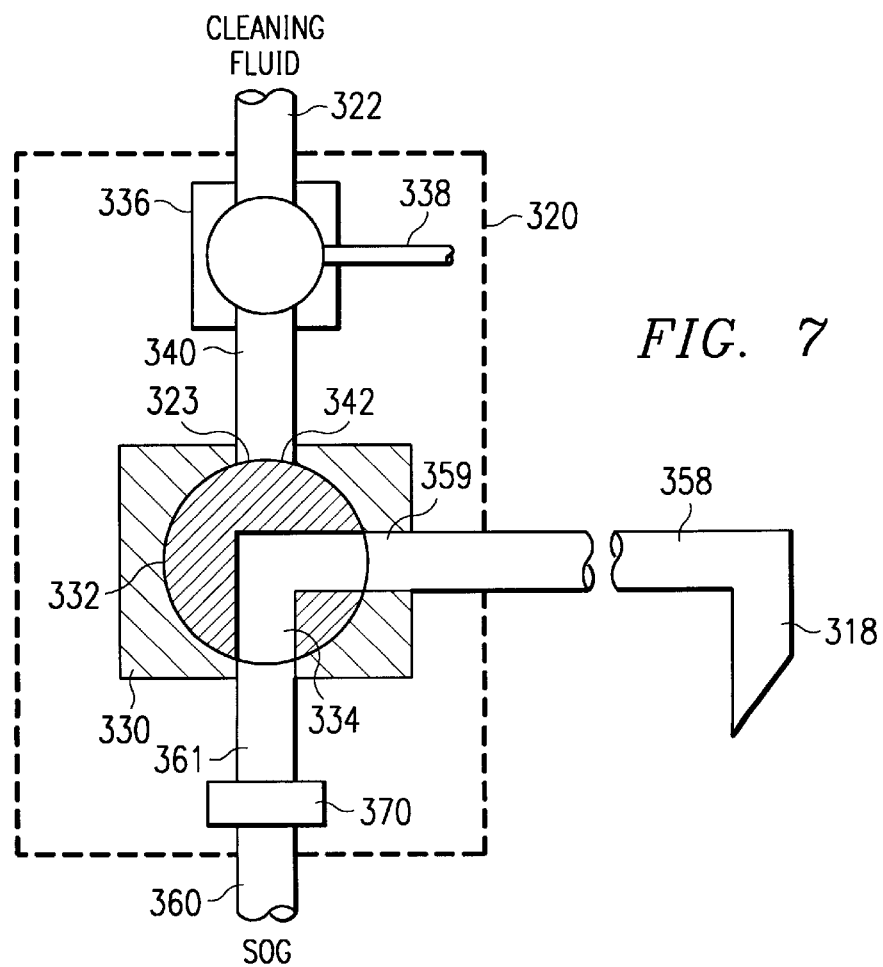
FIG. 7 is a schematic of another delivery nozzle valve subsystem at a first time.

Referring now to FIG. 7, another delivery nozzle valve subsystem 320 that is acceptable for use with a system for delivering SOG, such as system 12 of FIGS. 1 and 2, is shown. System 320 selectively provides either SOG or a cleaning fluid to delivery nozzle 318. A first SOG supply line 360 is coupled to and provides SOG to valve subsystem 320 from a SOG reservoir or supply. A cleaning fluid supply line 322 provides cleaning fluid to valve subsystem 320 from a clean fluid reservoir or supply. A pull back valve 370 may be placed on a portion of SOG supply line 360 or line 358 to provide a negative pressure to pull SOG away from a portion of nozzle 318 during termination of SOG delivery to nozzle 318.

Line 360 delivers SOG to a valve 330 and SOG is thereby available for flow into valve 330 through a first fluid flow path 361. Valve 330 has a two-way-flow path device such as a rotatable elbow disk 332, which has an elbow passage 334 therein. Cleaning fluid supply line 322 may deliver a SOG cleaning fluid to valve 330, and cleaning fluid is thereby available for flow into valve 330 through a second fluid flow path 323. A second valve 336 may be located on cleaning fluid supply line 322 prior to valve 330. Valve 336 may be a three-way valve allowing for supplying a neutral gas from a neutral gas supply line 338 or other gas such as helium to valve 330 or alternatively to supply cleaning fluid to valve 330. The neutral gas delivered to valve 330 facilitates drying of cleaning solution from downstream components including portions of valve 330, line 358 and nozzle 318. Valve 336 may be coupled to valve 330 by an intermediate line or conduit 340.

In the condition shown in FIG. 7, a first surface 342 of valve 330 is shown closing off intermediate line 340. Passage 334 is aligned with supply line 360 to allow SOG to flow through a third fluid flow path 359 of valve 330 into nozzle supply line 358 and to nozzle 318. Once it is desired to stop the flow of SOG, disk 332 may be rotated as shown in FIG. 8. Note that in the closed position shown in FIG. 8, a second surface 344 closes off SOG supply line 360. This process may continue during processing with rotation in one direction to close valve 330 and then in another direction to open it, or disk 332 may make a complete revolution. Alternatively, disk 332 may be rotated 45 degrees counter-clockwise so that an intermediate position rests between the two dispense positions (FIGS. 7 and 9) which may provide for faster activation.

Once the system, e.g. system 12 of FIG. 1, has been dormant for a sufficient period of time or after certain number of processing cycles, it may be desirable to clean nozzle 318. When cleaning is desired, disk 332 may be rotated such that the elbow passageway 334 will allow cleaning fluid from intermediate line 340 into nozzle supply line 358 as shown in FIG. 9. Note that second surface 344 has passed the intermediate line 340 thus cleaning it with cleaning solution by continuously rotating disk 332 throughout the operation. In this manner, the valve seats and surfaces are cleaned as they pass intermediate line 340 which is filled with cleaning solution. Once cleaning is complete, disk 332 may be rotated back around to allow passageway 334 to align SOG supply line 360 and nozzle supply line 358 to deliver SOG to nozzle 318, or an intermediate position to close all of the involved conduits or lines 360, 340, 358. Optionally, after finishing the cleaning process shown in FIG. 9, valve 336 may be closed to the cleaning fluid of cleaning fluid supply line 322 and neutral gas from neutral supply gas line 338 may be supplied to blow cleaning solution from the surfaces that are fluidly connected and out of nozzle 318 and to dry the surfaces therein.

Figure 10:
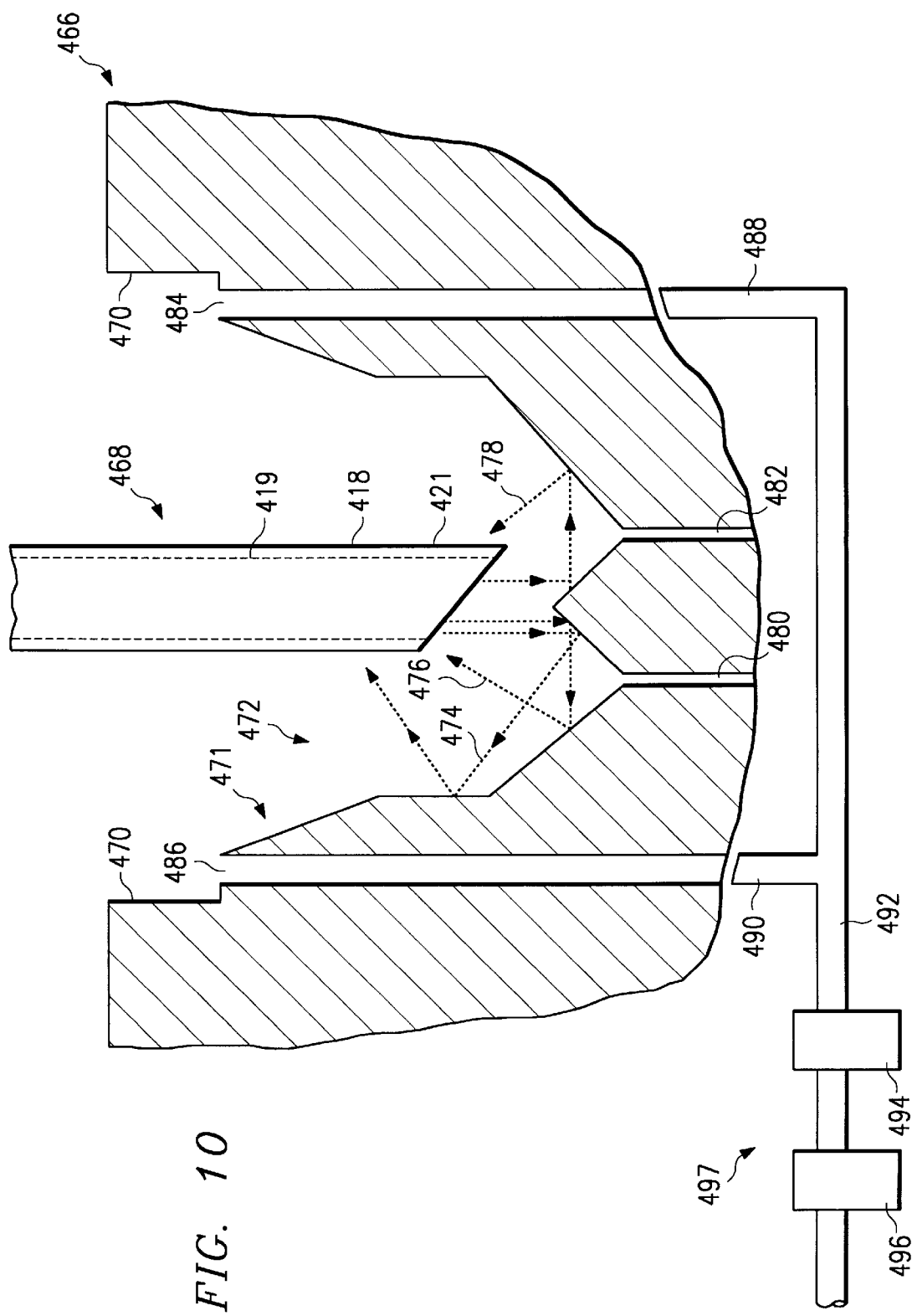
FIG. 10 is a cross sectional schematic of a nozzle cleaning station according to an aspect of the present invention.

Referring now to FIG. 10, a nozzle waiting and cleaning station 466 is shown that is suitable for use has nozzle waiting and cleaning station 66 in FIG. 2. Station 466 provides a place where main delivery nozzle 418, which may be used for the delivery of SOG to a substrate, may be positioned during dormant periods as well as during a cleaning cycle in which a cleaning fluid is passed through internal conduit 419 of nozzle 418. As shown in FIG. 10, nozzle 418 is in a cleaning cycle as will be described.

Station 466 includes a nozzle-receiving cavity housing having a cavity 468. Cavity 468 is formed to receive nozzle 418 so that when cleaning fluid is delivered with pressure through nozzle 418, the cleaning fluid will not leave cavity 468. Cavity 468 may be formed by a first upper sidewall 470 and a plurality of angled surfaces 472 that are shaped and positioned to cause cleaning fluid delivered through nozzle 418 to reflect substantially onto an outer portion or exterior surface 421 of nozzle 418 or to otherwise cause a turbulent flow of cleaning fluid around exterior portion 421 of nozzle 418. In this regard, three illustrative possible flow paths for the cleaning fluid delivered by nozzle 418 are shown as 474, 476, and 478. Note that the trajectory of the cleaning fluid from nozzle 418 relative to the angled surfaces 472 is such that the cleaning fluid will reflect and impact the exterior surface 421 of the nozzle. To improve the agitati6n of the cleaning fluid on the exterior 421 of nozzle 418 the cleaning fluid delivered to nozzle 418 may be pulsed.

A first drain 480 and a second drain 482 may be located on a lower portion of the cavity 468 for collecting and removing any SOG that may be cleaned from nozzle 418 as well as a portion of the cleaning fluid. Drains 480 and 482 may couple to a facility drain to properly dispose of liquids and particles therein. Alternatively, drains 480 and 482 may be coupled to drain line 492 for filtering and recirculation.

It is typically desirable during some portion of a cleaning cycle to have cavity 468 fill with cleaning fluid. One way this may be accomplished is by making the flow rate of drains 480 and 482 less than the flow rate of the cleaning fluid that is delivered through nozzle 418 during a cleaning cycle. Thus, during a cleaning cycle, drains 480 and 482 will remove some contaminants and cleaning fluid, but will allow the cavity 468 to fill with cleaning solution because of the larger flow rate through nozzle 418. Another way is to add valves to drains 480 and 482 that may be open initially and then later in the cleaning cycle may be closed to allow cavity 468 to fill.

During a cleaning cycle, the cleaning fluid will rise on cavity 468 until it reaches a first overflow drain 484 and a second overflow drain 486. First overflow drain 484 is coupled to a first overflow drain line 488, and second overflow drain 486 is coupled to a second overflow drain line 490. Drain lines 488 and 490 feed into a third overflow drain line 492.

A filtering-and-recirculation subsystem 497 may be provided for filtering SOG and contaminants from the cleaning fluid delivered through line 492 and recirculating the cleaning fluid for delivery to nozzle 418 again. Filtering-and-recirculation subsystem 497 may include filter 494 and recirculation subsystem 496 to remove contaminates such as particulates and SOG from the fluid. Filter 494 may filter the contaminants and SOG from the cleaning fluid. After filtering at filter 494, cleaning fluid in line 492 may be delivered to a recirculation subsystem 496, which may include a pump and additional filters, for making the previously used cleaning fluid available to nozzle 418 again.

In operation, nozzle 418 is positioned within cavity 468 and the cleaning cycle may begin. Cleaning fluid delivered through nozzle 418 is reflected or bounced off of the plurality of angled surfaces 472 to impact the exterior portion 421 of nozzle 418 and clean SOG from it. The cleaning fluid passing through conduit 419 removes substantially all the SOG from it. Any contaminants or SOG may flow out of drains 480 and 482. Because drains 480 and 482 drain at a slower rate than cleaning fluid being delivered through nozzle 418, cavity 468 will fill until the cleaning fluid reaches overflow drains 484 and 486. Cleaning fluid may then leave cavity 468 through overflow drains 484 and 486 which are coupled to drain lines 488 and 490, respectively, to a third overflow drain line 492. The cleaning fluid may then be filtered with a filter 494 and recirculated by recirculation subsystem 496. When it is desirable to prepare nozzle 318 to deliver SOG again, nozzle 418 may be positioned in station 466 so that any excess SOG applied to prime nozzle 418 will be delivered into station 466 and drains 480 and 482.

Although the invention has been particularly shown and described by the foregoing detailed description, it will be understood by those skilled in the art that various other changes in form and detail may be made without departing from the spirit and scope of the invention, which is defined by the appended claims.

What is claimed is:

1. A method for applying spin-on-glass (SOG) to a substrate through a delivery nozzle and for cleaning the delivery nozzle with a cleaning fluid, the method comprising the steps of:

delivering SOG to the substrate, wherein the step of delivering SOG comprises the steps of:
        placing a delivery nozzle over a substrate on a chuck,
        causing relative circular motion between the delivery nozzle and chuck, and
        delivering SOG from a SOG supply line through a valve subsystem to an interior conduit of the delivery nozzle; and
    cleaning the delivery nozzle when cleaning is desirable, wherein the step of cleaning the delivery nozzle comprises the step of:
        forming a cleaning station having a nozzle-receiving-cavity having a plurality of angled surfaces positioned on a trajectory path of cleaning fluid delivered through the nozzle so as to reflect a portion of the cleaning fluid onto an exterior portion of the delivery nozzle,
        positioning the delivery nozzle over the cleaning station, and
        delivering the cleaning fluid from a cleaning fluid supply line through the valve subsystem to the interior conduit of the delivery nozzle to remove any SOG from the interior conduit of the nozzles said delivering of cleaning fluid having sufficient pressure to cause the cleaning fluid to reflect at least in part from the plurality of angled surfaces onto the exterior portion of the delivery nozzle to remove SOG therefrom.

2. The method of claim 1 wherein the step of cleaning the nozzle further comprises the steps of:
    capturing the cleaning fluid after the cleaning fluid is dispensed from the nozzle;
    filtering the cleaning fluid that has been captured; and
    recirculating the captured cleaning fluid to the cleaning fluid supply line.

3. The method of claim 1, further comprising the step of:
    filling said nozzle-receiving-cavity to a level above an end portion of the nozzle; and
    draining said nozzle-receiving-cavity from at least one overflow drain disposed above said end portion of the nozzle.

4. The method of claim 1, wherein:
    said step of delivering cleaning fluid including pulsed delivery of cleaning fluid to provide agitation of cleaning fluid on the exterior portion of the nozzle.

5. The method of claim 1, further comprising the steps of:
    filling said nozzle-receiving-cavity to a level above an end portion of the nozzle; and
    draining said nozzle-receiving-cavity from at least one overflow drain disposed above said end portion of the nozzle.

6. The method of claim 1, further comprising the step of:
    delivering cleaning fluid via the delivery nozzle in a pulsed manner to provide agitation of cleaning fluid on the exterior portion of the nozzle.

7. A method for manufacturing a system for delivering spin-on-glass (SOG) to a substrate, the method comprising the steps of:
    forming a spin chuck for spinning a substrate;
    forming a delivery nozzle having an interior conduit;
    forming a delivery nozzle-positioning subsystem for selectively positioning the delivery nozzle over the spin chuck for delivery of SOG to a substrate;
    coupling the delivery nozzle-positioning subsystem to the delivery nozzle;
    forming a SOG supply line for supplying SOG;
    forming a cleaning fluid supply line for supplying a cleaning fluid for removal of dried SOG;
    forming a valve subsystem for selectively delivering SOG or a cleaning fluid to the interior conduit of the delivery nozzle;
    coupling the valve subsystem to the SOG supply line, cleaning-fluid supply line, and the delivery nozzle; and
    forming a nozzle cleaning station, and wherein the step of forming the nozzle cleaning station comprises the steps of:
        forming a nozzle-receiving-cavity housing having a cavity for receiving the delivery nozzle during cleaning; and
        delivered through the interior conduit of the delivery nozzle onto an exterior surface of the delivery nozzle.

8. The method of claim 7 further comprising the step of forming a control unit coupled to the delivery nozzle-positioning subsystem and the valve subsystem for automatically controlling delivery of SOG or cleaning fluid to the delivery nozzle.

9. The method of claim 7 wherein the step of forming the delivery nozzle valve subsystem comprises the step of forming a three-way valve.

10. The method of claim 7 wherein the step of forming a delivery nozzle valve subsystem comprises the steps of:
    forming an intermediate conduit;
    forming a first valve for supplying SOG to the intermediate conduit when the first valve is open;
    coupling the first valve to the SOG supply line and the intermediate conduit;
    forming a second valve for supplying cleaning fluid to the intermediate conduit when the second valve is open;
    coupling the second valve to the cleaning-fluid supply line and the intermediate conduit, the second valve;
    forming a third valve for selectively providing fluid flow between the intermediate conduit and the delivery nozzle; and
    coupling the third valve to the intermediate conduit and the delivery nozzle.

11. The method of claim 7 wherein the step of forming a delivery nozzle valve subsystem comprises the steps of forming a valve having a first fluid flow path coupled to the SOG supply line, a second fluid flow path coupled to the cleaning-fluid supply line, and third fluid flow path coupled to the delivery nozzle and having a two-way-flow-path-connecting device for selectively connecting the SOG supply line and the delivery nozzle or the cleaning-fluid supply line and the delivery nozzle.

12. The method of claim 7 further comprising the step of forming a nozzle cleaning station, and wherein the step of forming the nozzle cleaning station comprises the steps of:

forming a drain coupled to the nozzle-receiving-cavity housing for removing cleaning fluid from the cavity; and forming a filtering-and-recirculation subsystem for filtering and returning at least a portion of cleaning fluid captured by the drain to the valve subsystem.

13. The method of claim 7 further comprising the steps of:

forming a neutral gas supply line;

coupling the neutral supply line to the valve subsystem for delivering a neutral gas to the valve subsystem; and wherein the step of forming the valve subsystem further comprises forming the valve subsystem operable to selectively cause a neutral gas from the neutral gas supply line to be delivered to the delivered nozzle for drying the interior conduit of the delivery nozzle.

14. A system for delivering spin-on-glass (SOG) to a substrate, the system comprising:

a spin chuck for spinning a substrate;

a delivery nozzle having an interior conduit;

a delivery nozzle-positioning subsystem coupled to the delivery nozzle for selectively positioning the delivery nozzle over the spin chuck for delivery of SOG to a substrate;

a SOG supply line for supplying SOG;

a cleaning fluid supply line for supplying a cleaning fluid for removal of dried SOG;

a valve subsystem fluidly coupled to the SOG supply line, cleaning-fluid supply line, and the delivery nozzle, the valve subsystem for selectively delivering SOG or a cleaning fluid to the interior conduit of the delivery nozzle; and a nozzle cleaning station including a nozzle-receiving-cavity housing having a cavity for receiving the receiving nozzle during cleaning; and a plurality of angled surfaces coupled to the nozzle-receiving-cavity housing for reflecting a cleaning fluid delivered through the interior conduit of the delivery nozzle onto an exterior surface of the delivery nozzle.

15. The system of claim 14 further comprising a control unit coupled to the delivery nozzle-positioning subsystem and the valve subsystem for automatically controlling delivery of SOG or cleaning fluid to the delivery nozzle.

16. The system of claim 14 wherein the delivery nozzle valve subsystem comprises a three-way valve.

17. The system of claim 14 wherein the delivery nozzle valve subsystem comprises:

an intermediate conduit;

a first valve coupled to the SOG supply line and the intermediate conduit, the first valve for supplying SOG to the intermediate conduit when the first valve is open;

a second valve coupled to the cleaning-fluid supply line and the intermediate conduit, the second valve for supplying cleaning fluid to the intermediate conduit when the second valve is open; and a third valve coupled to the intermediate conduit and the delivery nozzle, the third valve for selectively providing fluid flow between the intermediate conduit and the delivery nozzle.

18. The system of claim 14 wherein the delivery nozzle valve subsystem comprises a valve having a first fluid flow path coupled to the SOG supply line, a second fluid flow path coupled to the cleaning-fluid supply line, and third fluid flow path coupled to the delivery nozzle supply line, and the valve having a two-way-flow-path-connecting device for selectively connecting the SOG supply line and the delivery nozzle or the cleaning-fluid supply line and the delivery nozzle.

19. The system of claim 14 further comprising a nozzle cleaning station comprising:

a filtering-and-recirculation subsystem for filtering and returning at least a portion of cleaning fluid captured by the drain to the valve subsystem.

20. The system of claim 14 further comprising a neutral gas supply line coupled to the valve subsystem for delivering a neutral gas to the valve subsystem and wherein the valve subsystem is operable to selectively deliver a neutral gas from the neutral gas supply line to the delivery nozzle for drying the interior conduit of the delivery nozzle.

21. The system of claim 14 further comprising a control unit, and a wafer transfer mechanism coupled to the control unit for automatically placing a wafer on the spin chuck and for automatically removing a wafer from the spin chuck after processing.

22. The system of claim 1, wherein:

said nozzle-receiving-cavity housing further includes at least one first drain disposed at a lower portion of said nozzle-receiving-cavity housing for removing cleaning fluid from said nozzle-receiving-cavity housing, and at least one second drain for removing cleaning fluid from said nozzle-receiving-cavity housing disposed at a height whereby cleaning fluid in said nozzle-receiving-cavity covers an end portion of the nozzle when draining from said at least one second drain.

* * * * *